(12) United States Patent
Tsai et al.

(10) Patent No.: US 10,217,754 B2
(45) Date of Patent: Feb. 26, 2019

(54) SEMICONDUCTOR DEVICE AND METHOD OF FABRICATING THE SAME

(71) Applicant: MACRONIX International Co., Ltd., Hsinchu (TW)

(72) Inventors: Ya-Jung Tsai, Hsinchu (TW); Chun-Lien Su, Hsinchu (TW); Hsin-Fu Lin, Hsinchu (TW); Hung-Chi Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 482 days.

(21) Appl. No.: 14/278,981

(22) Filed: May 15, 2014

(65) Prior Publication Data

US 2015/0333077 A1 Nov. 19, 2015

(51) Int. Cl.
| | |
|---|---|
| *H01L 27/115* | (2017.01) |
| *H01L 27/11521* | (2017.01) |
| *H01L 29/788* | (2006.01) |
| *H01L 29/66* | (2006.01) |
| *H01L 21/265* | (2006.01) |
| *H01L 29/423* | (2006.01) |
| *H01L 21/762* | (2006.01) |
| *H01L 29/78* | (2006.01) |

(52) U.S. Cl.
CPC .. *H01L 27/11521* (2013.01); *H01L 21/26586* (2013.01); *H01L 21/762* (2013.01); *H01L 29/42324* (2013.01); *H01L 29/66666* (2013.01); *H01L 29/66825* (2013.01); *H01L 29/788* (2013.01); *H01L 29/7827* (2013.01); *H01L 29/7881* (2013.01)

(58) Field of Classification Search
CPC ............. H01L 27/115; H01L 27/11526; H01L 27/11546; H01L 27/11539; H01L 27/11529
USPC ......... 257/321, 322, 369, E21.686, E21.689, 257/E21.691, E27.103
See application file for complete search history.

(56) References Cited

U.S. PATENT DOCUMENTS

| | | | | |
|---|---|---|---|---|
| 4,701,776 A | * | 10/1987 | Perlegos | ............... H01L 27/115 257/321 |
| 2011/0278656 A1 | * | 11/2011 | Chang | .................. H01L 27/105 257/306 |

* cited by examiner

*Primary Examiner* — Hrayr A Sayadian
(74) *Attorney, Agent, or Firm* — J.C. Patents

(57) ABSTRACT

Provided is a method of fabricating a memory device including performing an ion implantation process by using a mask layer as an implanting mask, so as to form a first embedded doped region and a second embedded doped region in a substrate. The first embedded doped region extends along the first direction, passes through the control gate, and is electrically connected to the first doped region, the second doped region and the third doped region at two sides of control gates. The second embedded doped region extends along the second direction, is located in the substrate under the third doped region, and electrically connected to the third doped region. The first embedded doped region is electrically connected to the second embedded doped region.

7 Claims, 15 Drawing Sheets

SEMICONDUCTOR DEVICE AND METHOD OF FABRICATING THE SAME

BACKGROUND OF THE INVENTION

Field of the Invention

The invention relates to a semiconductor device and a method of fabricating the same, and more particularly, the invention relates to a memory device and a method of fabricating the same.

Description of Related Art

Non-volatile memory is characterized by maintaining the stored data even when the power is down, and has thus become a mandatory device in many electronic products for providing normal operation of the electronic products. In particular, flash memory is a type of the non-volatile memory that allows multiple times of data writing, reading and erasing operations. With these advantages, the flash memory has become one of the most widely adopted memory devices for personal computers and electronic equipments.

With increases in integration of the devices, the device is also continuously scaled down. However, not every component in the flash memory can be continuously reduced but to be maintained at a specific size. For instance, during fabrication of the flash memory, sizes of source rails and source contacts are fabricated to be greater than sizes of bit lines and drain contacts, so as to reduce sheet resistance. However, by adopting such method, a layout of the word lines can be complex because the word lines need to be designed in bent-shape for passing through the source rails, which results in that a photomask must also be redesigned to take in consideration of complex optical proximity correction issues. Therefore, a cost for the photomask is significantly high. Moreover, a processing allowance thereof also quite small and prone to problems such as non-uniformity.

SUMMARY OF THE INVENTION

The invention is directed to a memory device and a method of fabricating the same, capable of reducing sheet resistance of a source rail and a source contact.

The invention provides the memory device and the method of fabricating the same, in which a photomask can be used without going through complex optical proximity correction.

The invention provides the memory device and the method of fabricating the same, which can be integrated with existing processes.

The invention provides a fabricating method of a memory device. A plurality of isolation structures is formed in a substrate. Each of the isolation structures extending along a first direction. A plurality of control gates is formed on the substrate. Each of the control gates extends along a second direction. The first direction is different from the second direction. A tunneling dielectric layer, a floating gate and an inter-gate dielectric layer are sequentially formed on the substrate between any adjacent two of the isolation structures under each of the control gates. A plurality of first doped regions respectively is formed at two sides of the control gates in a first region of the substrate. A plurality of second doped regions respectively is formed at two sides of the control gates in a second region of the substrate. A plurality of third doped regions is formed in a third region of the substrate. The third region is located between the first region and the second region. A mask layer is formed on the substrate. The mask layer has a first opening and a second opening intersecting each other. The first opening extends along the first direction, and at least exposes a part of the first doped regions, a part of the second doped regions, a part of the third doped regions and a part of the control gates. The second opening extends along the second direction, and exposes the isolation structures and the third doped regions in the third region. The isolation structures exposed by the second opening are removed so as to form a plurality of first self-align trenches in the substrate. An ion implantation process is performed by using the mask layer as an implanting mask, so as to form a first embedded doped region and a second embedded doped region. The first embedded doped region extends along the first direction, which is located in the substrate exposed by the first opening and passes through the control gates, and electrically connected to the first doped regions, the second doped regions and the third doped regions exposed by the first opening. The second embedded doped region extends along the second direction, which is located in the substrate under the third doped regions exposed by the second opening and in the substrate at bottoms and around sidewalls of the first self-align trenches, and electrically connected to the third doped regions. The first embedded doped region is electrically connected to the second embedded doped region; and removing the mask layer.

In an embodiment of the invention, the fabricating method of the memory device further includes: forming at least one first source contact on the first doped regions electrically connected to the first embedded doped region and closest to the second embedded doped region; and forming at least one second source contact on the second doped regions electrically connected to the first embedded doped region and closest to the second embedded doped region.

In an embodiment of the invention, the first opening exposes at least adjacent two of the first doped regions, at least adjacent two of the second doped regions, at least adjacent two of the third doped regions, at least one of the isolation structures and a part of the control gates, the step of forming the first self-align trenches in the substrate further includes removing the isolation structures exposed by the first opening thereby forming a plurality of second self-align trenches, and the first embedded doped region further extends to the substrate at bottoms and around sidewalls of the second self-align trenches.

In an embodiment of the invention, the fabricating method of the memory device further includes: in the first region, forming a first source contact on the second self-align trenches closest to the second embedded doped region electrically connected to the first embedded doped region; and in the second region, forming a second source contact on the second self-align trenches closest to the second embedded doped region electrically connected to the first embedded doped region.

In an embodiment of the invention, the fabricating method of the memory device further includes: forming at least two first source contacts on at least adjacent two of the first doped regions electrically connected to the first embedded doped region and closest to the second embedded doped region; and forming at least two second source contacts on at least adjacent two of the second doped regions electrically connected to the first embedded doped region and closest to the second embedded doped region.

In an embodiment of the invention, the first opening exposes a plurality of the adjacent first doped regions, a plurality of the adjacent third doped regions, a plurality of the adjacent second doped regions, a part of the control gates and the isolation structures being enclosed, the step of forming the first self-align trenches further includes removing the isolation structure exposed by the first opening thereby forming a plurality of second self-align trenches, and the first embedded doped region further extends to the substrate at bottoms and around sidewalls of the second self-align trenches.

In an embodiment of the invention, the fabricating method of the memory device further includes: forming a plurality of first source contacts on a plurality of the adjacent first doped regions electrically connected to the first embedded doped region and closest to the second embedded doped region; and forming a plurality of second source contacts on a plurality of the adjacent second doped regions electrically connected to the first embedded doped region and closest to the second embedded doped region.

In an embodiment of the invention, the ion implantation process is a tilt angle ion implantation process.

In an embodiment of the invention, an included angle between an ion implanting direction of the tilt angle ion implantation process and a normal line of the substrate is 0 degrees to 35 degrees.

In an embodiment of the invention, an implantation dosage of the ion implantation process is $5 \times 10^{13}/cm^2$ to $3 \times 10^{14}/cm^2$.

In an embodiment of the invention, an implantation energy of the ion implantation process is 10 KeV to 35 KeV.

The invention also provides a memory device. The memory device includes a substrate, having a first region, a second region, and a third region. The third region is located between the first region and the second region. The substrate has a plurality of first self-align trenches therein. A first embedded doped region extends along a first direction, and is located in the substrate of a part of the first region, a part of the second region and a part of the third region. A second embedded doped region extends along a second direction, which is located on the substrate of the third region at bottoms and around sidewalls of the first self-align trenches. The first embedded doped region is electrically connected to the second embedded doped region. The first direction is different from the second direction. A plurality of control gates extends along the second direction, which is located at two sides of the second embedded doped region, and crossed over the first embedded doped region. The memory device further includes a plurality of floating gates, a plurality of tunneling dielectric layers, and a plurality of inter-gate dielectric layers. Each of the floating gates is located between the corresponding control gates and the substrate. Each of the tunneling dielectric layers being located between the corresponding floating gate and the substrate. Each of the inter-gate dielectric layers being located between the corresponding floating gate and the corresponding control gate. A plurality of first doped regions is located on the substrate at two sides of each of the control gates in the first region. A plurality of second doped regions is located on the substrate at two sides of each of the control gates in the second region. A plurality of third doped regions is located on the substrate in the third region. The first embedded doped region passes through under the control gate electrically connected to a part of the first doped regions, a part of the second doped regions and a part of the third doped regions, and the second embedded doped region is electrically connected to the third doped regions.

In an embodiment of the invention, the memory device further includes: in the first region, a first source contact located on the first doped regions electrically connected to the first embedded doped region and closest to the second embedded doped region; and in the second region, a second source contact located on the first doped region electrically connected to the first embedded doped region and closest to the second embedded doped region.

In an embodiment of the invention, the first embedded doped region is electrically connected to at least two adjacent columns of the first doped regions, at least two adjacent columns of the second doped regions and at least adjacent two of the third doped regions, and further extending to the substrate at bottoms and around sidewalls of a plurality of second self-align trenches, wherein the second self-align trenches extend along the first direction arranged into a column, and located between the at least two adjacent columns of the first doped regions electrically connected to the first embedded doped region, between the at least two adjacent columns of the second doped regions electrically connected to the first embedded doped region, and between the at least two adjacent of the third doped regions electrically connected to the first embedded doped region.

In an embodiment of the invention, the memory device further includes: a first source contact located on the second self-align trenches closest to the second embedded doped region in the first region electrically connected to the first embedded doped region; and a second source contact located on the second self-align trenches closest to the second embedded doped region in the second region electrically connected to the first embedded doped region.

In an embodiment of the invention, the memory device further includes: in the first region, at least two first source contacts located on the at least adjacent two of the first doped regions electrically connected to the first embedded doped region and closest to the second embedded doped region; and in the second region, at least two second source contacts located on the at least adjacent two of the second doped regions electrically connected to the first embedded doped region and closest to the second embedded doped region.

In an embodiment of the invention, the first embedded doped region is electrically connected adjacent columns of the first doped region and adjacent columns of the second doped regions, and further extending to the substrate at bottoms and around sidewalls of a plurality of second self-align trenches, wherein the second self-align trenches extend along the first direction arranged into a plurality of columns, each column of the second self-align trenches is located in the substrate between two adjacent columns of the first doped regions electrically connected to the first embedded doped region, two adjacent columns of the second doped regions electrically connected to the first embedded doped region, and two of the adjacent third doped regions electrically connected to the first embedded doped region electrically connected to the first embedded doped region.

In an embodiment of the invention, the memory device further include: in the first region, a plurality of first source contacts, located on a plurality of the first doped regions electrically connected to the first embedded doped region and closest to the second embedded doped region; and in the second region, a plurality of second source contacts, located on a plurality of the second doped regions electrically connected to the first embedded doped region and closest to the second embedded doped region.

The memory device and the method of fabricating the same as disclosed in the invention are capable of reducing sheet resistance of a source rail and a source contact.

In the memory device and the method of fabricating the same as disclosed in the invention, a photomask can be used without going through complex optical proximity correction.

The memory device and the method of fabricating the same as disclosed in the invention can be integrated with existing processes.

To make the above features and advantages of the disclosure more comprehensible, several embodiments accompanied with drawings are described in detail as follows.

DESCRIPTION OF THE EMBODIMENTS

FIG. 1A to FIG. 1E are top views illustrating a flowchart of a method of fabricating a memory device according to first embodiment of the invention. FIG. 2A to FIG. 2E illustrate cross-sectional views of FIG. 1A to FIG. 1E along line II-II. FIG. 3A to FIG. 3E illustrate cross-sectional views of FIG. 1A to FIG. 1E along line III-III. FIG. 4A to FIG. 4E illustrate cross-sectional views of FIG. 1A to FIG. 1E along line IV-IV.

Figure 1A:
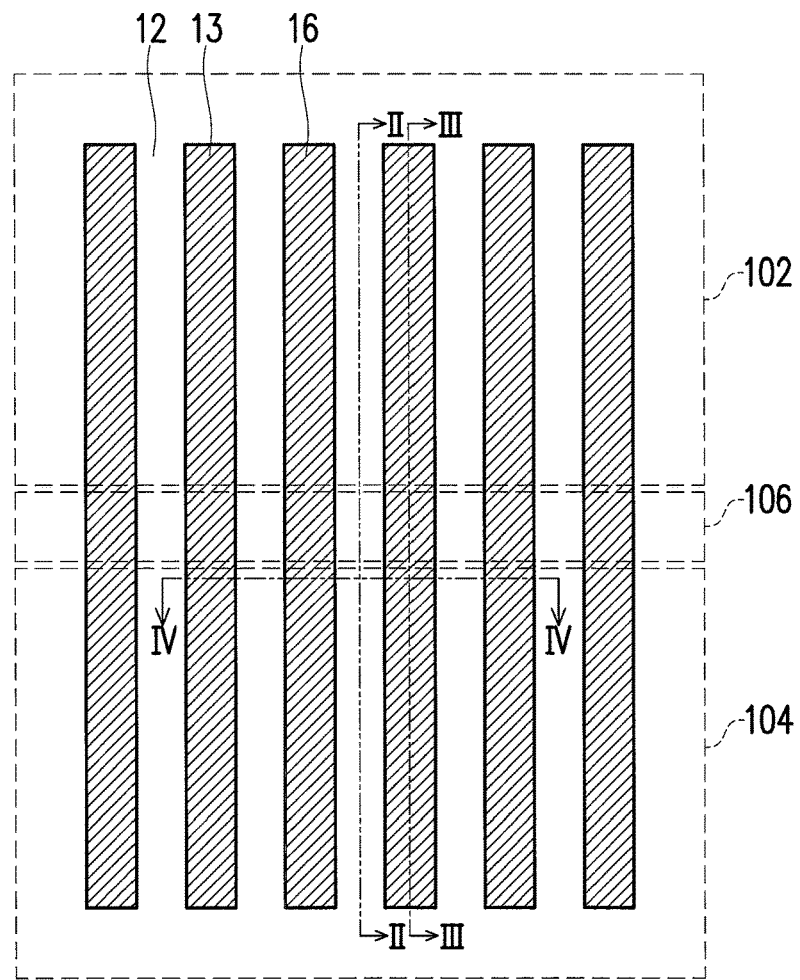
FIG. 1A to FIG. 1E are top views illustrating a flowchart of a method of fabricating a memory device according to first embodiment of the invention.
Figure 2A:
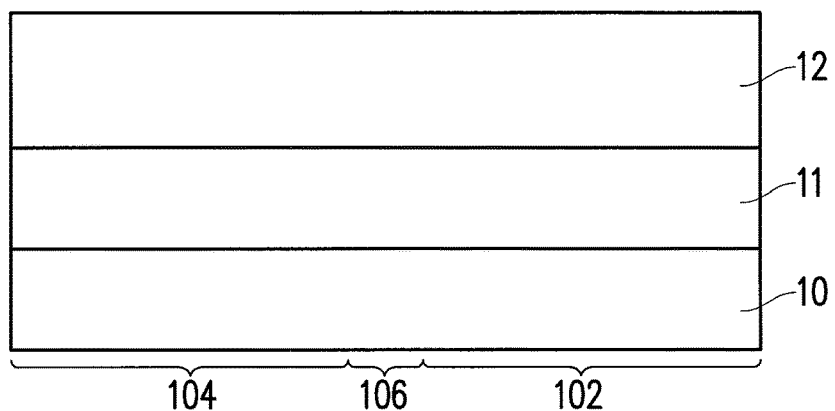
FIG. 2A to FIG. 2E illustrate cross-sectional views of FIG. 1A to FIG. 1E along line II-II.

Referring to FIG. 1A, a substrate 10 is provided. The substrate 10 includes the first region 102, the second region 104, and the third region 106. The third region 106 is located between the first region 102 and the second region 104. The substrate 10 is, for example, a semiconductor substrate, a semiconductor compound substrate, or a semiconductor over insulator (SOI). The semiconductor substrate is, for example, a substrate composed of atoms in group IVA, such as silicon or germanium. The semiconductor compound is, for example, a substrate composed of a semiconductor compound including atoms in group IVA, such as silicon germanium or silicon carbide, or a substrate composed of a semiconductor compound including atoms in group IIIA and group VA (e.g., gallium arsenide). A well region 11 may be formed in the substrate 10. The well region 11 has a dopant of a first conductivity type. In an embodiment, the dopant of the first conductivity type is a P-type dopant for example. In another embodiment, the dopant of the first conductivity type is a N-type dopant for example. The P-type dopant is boron for example. The N-type dopant is phosphorous or arsenic for example.

A plurality of isolation structures 12 extending along a first direction is formed in the well region 11 of the substrate 10 to define a plurality of active regions 13. The first direction may be a X-direction or a Y-direction. In the drawings of the present embodiment, the first direction is the Y-direction for example. A forming method of the isolation structures 12 includes a shallow trench isolation (STI) or a deep trench isolation (DTI). A material of the isolation structure 12 may be an isolation material such as a silicon oxide. The silicon oxide may be a spin-on glass (SOG) or a high density plasma oxide (HDP oxide).

Next, still referring to FIG. 1A to FIG. 4A, a tunneling dielectric layer 14 and a conductive layer 16 both extending along the first direction are formed on the substrate 10 in the active region 13. A method of forming the tunneling dielectric layer 14 and the conductive layer 16 includes, for example, forming a tunneling dielectric material layer and a conductive material layer on the substrate 10, followed by patterning the tunneling dielectric material layer and the conductive material layer by using a photolithography process. The tunneling dielectric material layer may be composed of a single material layer. The single material layer is a low dielectric constant material or a high dielectric constant material for example. The low dielectric constant material is a dielectric material having a dielectric constant lower than 4, such as silicon oxide or silicon nitride. The high dielectric constant material is a dielectric material having dielectric constant higher than 4, such as HfAlO, $HfO_2$, $Al_2O_3$ or $Si_3N_4$. The tunneling dielectric material layer may also be a dual-layer stack structure or a multi-layer stack structure, which are capable of increasing injected current and selected based on band-gap engineering (BE) theory. The dual-layer stack structure is, for example, a dual-layer stack structure composed of the low dielectric constant material and the high dielectric constant material (thereafter, represented by "the low dielectric constant material/the high dielectric constant material"), such as $SiO_2$/HfSiO, $SiO_2$/$HfO_2$ or $SiO_2$/$Si_3N_4$. The multi-layer stack structure may be a multi-layer stack structure composed of the low dielectric constant material(s) and the high dielectric constant material(s) (thereafter, represented by "the low dielectric constant material/the high dielectric constant material/the low dielectric constant material"), such as $SiO_2$/$Si_3N_4$/$SiO_2$ or $SiO_2$/$Al_2O_3$/$SiO_2$. A method of forming the tunneling dielectric material layer includes, for example, a chemical vapor deposition, an in-situ steam generation (ISSG), a low pressure radical oxidation (LPRO) or a furnace oxidation. A material of the conductor material layer includes for example, a doped polysilicon, an undoped polysilicon or a combination thereof, and a method of forming the same includes the chemical vapor deposition. The dopant used in the doped polysilicon is, for example, boron. In an embodiment, a thickness of the tunneling dielectric layer 14 is 80 nm to 120 nm; and a thickness of the conductive layer 16 is 40 nm to 120 nm.

Referring to FIG. 1B to FIG. 4B, an inter-gate dielectric layer 18 and the a conductive layer 20 extending along a second direction are formed on the substrate 10, and the conductive layer 16 and the tunneling dielectric layer 14 are patterned into a conductive layer 16a and a tunneling dielectric layer 14a. The conductor layer 16a is, for example, used as a floating gate; and the conductive layer 20 is, for example, used as a control gate (also referred to as a word line). The second direction is different from the first direction. The second direction and the first direction may be perpendicular to each other, for example. The second direction may be the Y-direction or the X-direction. In the drawings of the present embodiment, the second direction is the X-direction for example. More specifically, an inter-gate dielectric material layer and a conductive material layer are formed on the substrate 10, followed by patterning the inter-gate dielectric material layer and the conductive layer to form the inter-gate dielectric layer 18 and the conductive layer 20. After the inter-gate dielectric layer 18 and the conductive layer 20 are formed, an etching process is proceeded to pattern the conductive layer 16 and the tunneling dielectric layer 14 into the conductive layer 16a and the tunneling dielectric layer 14a. In an embodiment, the inter-gate dielectric material layer is, for example, a composite layer composed of oxide-nitride-oxide (ONO). Such composite layer may include three or more layers, but the invention is not limited thereto. A method of forming the composite layer includes the chemical vapor deposition, or a thermal oxidation. A material of the conductor material includes, for example, a doped polysilicon, an undoped polysilicon or a combination thereof, and a method of forming the same includes a chemical vapor deposition. A thickness of the conductive layer 20 is, for example, 10 nm to 18 nm.

Figure 1B:
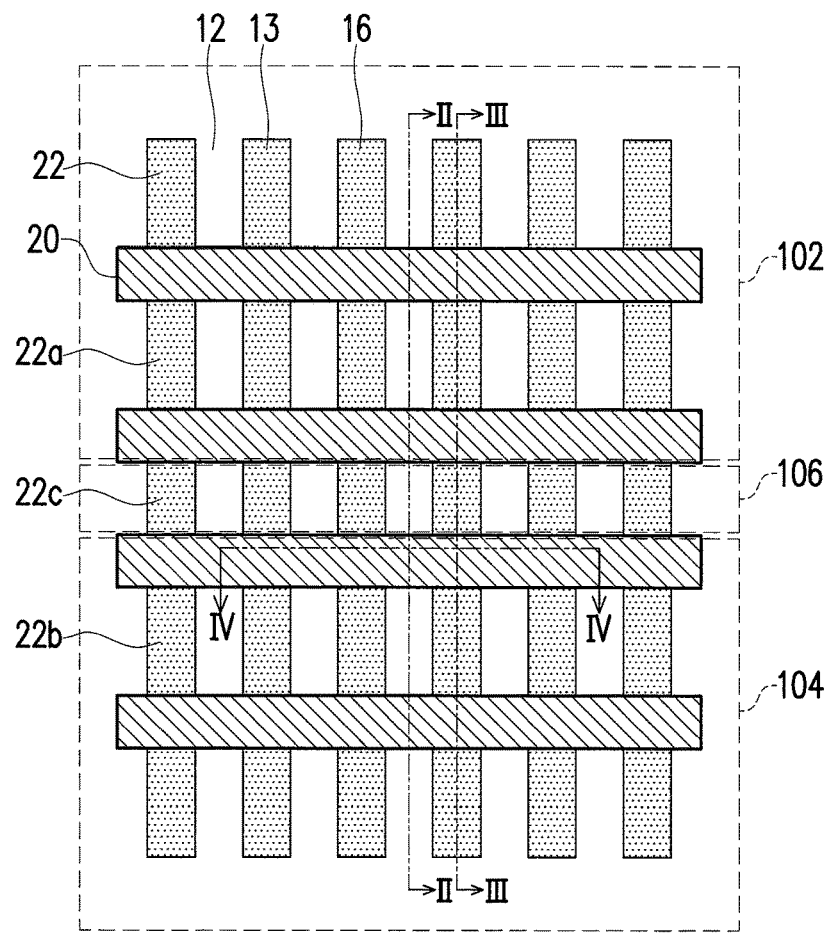
Figure 2B:
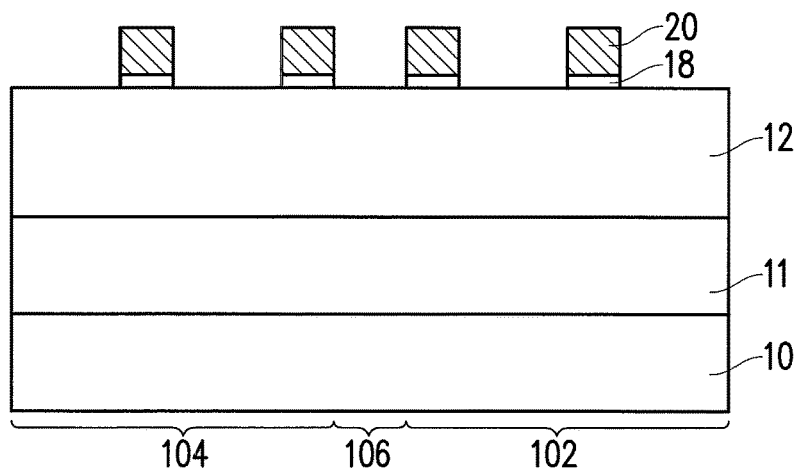

Afterward, a plurality of doped regions 22 is formed in the active regions 13 at two sides of the conductive layer 20. The doped regions 22 may be formed by performing an ion implantation process by using the conductive layer 20 as an implanting mask. In an embodiment, the substrate 10 and the well region 11 are of the first conductive type; and the doped region 22 is of a second conductive type. In an embodiment, the first conductivity type is the P-type; and the second conductivity type is the N-type, for example. In another embodiment, the first conductivity type is the N-type; and the second conductivity type is the P-type, for example. In an exemplary embodiment, a dopant implemented in the substrate 10 and the well region 11 is, for example, boron; a dopant implemented in the doped regions 22 is, for example, phosphorus or arsenic, a doping dosage thereof is, for example, $5 \times 10^{13}/cm^2$ to $2 \times 10^{14}/cm^2$, and an implanting energy thereof is, for example, 5 KeV to 15 KeV. In FIG. 1B, the doped regions 22 include doped regions 22a in the first region 102, doped regions 22b in the second region 104 and doped regions 22c in the third region 106.

Referring to FIG. 1C to FIG. 4C, a mask layer 200 is formed on the substrate 10. The mask layer 200 includes a first opening 202 and a second opening 204 intersecting each other. The first opening 202 extends along the first diction, exposes adjacent two columns of the doped regions 22a, adjacent two columns of the doped regions 22b in the second region 106, and adjacent two of the doped regions 22c, a plurality of conductive layers (the control gates) 20 and the isolation structures 12 being enclosed. The second opening 204 extends along the second direction, and exposes the plurality of adjacent doped regions 22c in the third region 106 and the isolation structures 12 being enclosed. In an embodiment, the second opening 204 may extend to expose a part of the conductive layers (the control gates) 20. A forming method of the mask layer 200 includes, for example, forming a photoresist layer on the substrate 10, followed by patterning the photoresist layer by a lithography process.

Thereafter, still referring to FIG. 1C to FIG. 4C, an anisotropic etching process (e.g., a plasma etching process) is perform by using the mask layer 200 as an etching mask to remove the isolation structures 12 exposed by the first opening 202, so as to form a plurality of self-align trenches 206 in the substrate 10 to expose the well region 11. Meanwhile, the isolation structures 12 exposed by the second opening 204 are also removed to form a plurality of self-align trenches 208 to expose the well region 11 of the substrate 10. In an embodiment, the self-align trenches 206 extend along the first direction to be arranged into a column, and the self-align trenches 206 extend along the second direction to be arranged into a row.

Thereafter, referring to FIG. 1D to FIG. 4D, an ion implantation process 210 is performed by using the mask layer 200 as an implanting mask, so as form an embedded doped region 212 and an embedded doped region 214 electrically connected to each other. The ion implantation process 210 is, for example, a tilt-angle ion implantation process. An included angle θ between an ion implanting direction of the tilt angle ion implantation process and a normal line of the substrate 10 is, for example, 0 degrees to 35 degrees. An implantation dosage of the ion implantation process 210 is, for example, $5 \times 10^{13}/cm^2$ to $3 \times 10^{14}/cm^2/cm^2$. An implantation energy of the ion implantation process 210 is, for example, 10 KeV to 35 KeV. By using the tilt angle ion implantation process, the dopant may be implanted into the well region 11 at bottoms of the self-align trenches 206 and laterally implanted into the well region 11 at a sidewall of the self-align trenches 206, and this not only allows the formed embedded doped region 212 to be located in the well region 11 at bottom portion of the self-align trenches 206 but also implanted into the well region 11 under the control gates 20, so as to continuously extend at the first direction and to be electrically connected to the doped regions 22a, the doped regions 22b and the doped regions 22c exposed by the first opening 202. Similarly, the embedded doped region 214 is located at the well region 11 under the doped regions 22c exposed by the second opening 204 and the well region 11 under the self-align trenches 208, so as to continuously extend along the second direction and to be electrically connected to the doped regions 22c.

Afterwards, referring to FIGS. 1E to 4E, the mask layer 200 is removed. A method of removing mask layer 200 includes a wet strip process, a dry strip process or a combination thereof. Thereafter, two source contacts 216a and 216b, a plurality of drain contacts 218, two source contacts 220a and 220b and a plurality of drain contacts 222 are formed on the substrate 10. More specifically, the source contacts 216a and 216b and the drain contacts 218 are located in the first region 102. The source contacts 216a and 216b are located on the two doped regions 22a closest to the embedded doped region 214, and electrically connected to the embedded doped region 212. The drain contacts 218 are located on the others of the doped regions 22a closest to the embedded doped region 214, and not electrically connected to the embedded doped region 212. The source contacts 220a and 220b and the drain contact 222 are located in the second region 104. The source contacts 220a and 220b are located on the two doped regions 22b closest to the embedded doped region 214, and electrically connected to the embedded doped region 212. The drain contacts 222 are located on the others of the doped regions 22b closest to the embedded doped region 214, and not electrically connected to the embedded doped region 212. The embedded doped regions 212 are electrically connected to the source contacts 216a and 216b and the source contacts 220a and 220b (thus, also referred to as a source rail).

Referring to FIG. 1E to FIG. 4E, a memory device includes the substrate 10, the well region 11, the tunneling dielectric layers 14a, the conductive layers (the floating gates) 16a, the inter-gate dielectric layers 18, the conductive layers (the control gates) 20, the embedded doped regions 212 and 214, the doped regions 22a, 22b and 22c, the two source contacts 216a and 216b, the two source contacts 220a and 220b, the drain contacts 218 and the drain contacts 222.

The substrate 10 includes the first region 102, the second region 104, and the third region 106. The third region 106 is located between the first region 102 and the second region 104. Further, the substrate 100 includes the self-align trenches 206 and the self-align trenches 208. The self-align trenches 206 extend along the first direction into a column from the first region 102 to the third region 106. More specifically, the self-align trenches 206 are located between adjacent two of the doped regions 22a, between adjacent two of the doped regions 22b, and between adjacent two of the doped regions 22c. The self-align trenches 208 extend along the second direction into a row.

The conductive layers (the control gates) 20 extend along the second direction to be located on the substrate 10 at two sides of the embedded doped region 214 and crossed over the embedded doped region 212. Each conductive layer (the floating gate) 16a is located between the corresponding conductive layer (the control gate) 20 and the substrate 10. Each tunneling dielectric layer 14a is located between the corresponding conductive layer (the floating gate) 16a and the substrate 10. Each inter-gate dielectric layer 18 is located between the corresponding conductive layer (the floating gate) 16a and each conductive layer (the control gate) 20.

The doped region 22a is located in the well region 11 at two sides of the conductive layer (the control gate) 20 in the first region 102. The doped region 22b is located in the well region 11 at two sides of the conductive layer (the control gate) 20 in the second region 104. The doped region 22c is located in the well region 11 in the third region 106.

The embedded doped region 212 extends along the first direction to be located in the first region 102, the second region 104 and the third region 106, and in the well region 11 at the bottoms and the sidewalls of the self-align trenches 206 formed after removing the isolation structures 12, and the embedded doped region 212 is electrically connected to the two source contacts 216a and 216b and the two source contacts 220a and 220b (thus, also referred as the source rail). The embedded doped region 214 extends along the second direction to be located in the third region 106, and in the well region 11 at the bottoms and the sidewalls of the self-align trenches 208. The embedded doped region 212 is electrically connected to the embedded doped region 214. The first direction is different from the second direction. In the present embodiment, the embedded doped region 212 passes through under the conductive layers (the control gates) 20 to be electrically connected to adjacent two columns of the doped regions 22a, the adjacent two of the doped regions 22c and the adjacent two columns of the doped regions 22b. The embedded doped region 214 is electrically connected to one row of the doped regions 22c. Memory cells at an intersection of the embedded doped region 212 and the embedded doped region 214 may also be referred to as composite punch cells (i.e., a memory cell surrounded by a region A in the drawing).

The drain contacts 218 are located on a portion of the doped regions 22a closest to the embedded doped region 214 in the first region 102, and not electrically connected to the embedded doped region 212. The source contacts 222 are located on a portion of the doped regions 22c closest to the embedded doped region 214 in the second region 104, and not electrically connected to the embedded doped region 212.

In the present embodiment, the two source contacts 216a and 216b and the drain contacts 218 are at the same side in the first region 102; and the two source contacts 220a and 220b and the drain contacts 222 are at the same side in the second region 104. More specifically, the two source contacts 216a and 216b are located on the two doped regions 22a electrically connected to the embedded doped region 212 and closest to the embedded doped region 214 in the first region 102, and located between the drain contacts 218. The two source contacts 220a and 220b are located on the two doped regions 22c electrically connected to the embedded doped region 212 and closest to the embedded doped region 214 in the second region 104, and located between the drain contacts 222. When a voltage Vg1 is applied to a word line W2, a voltage Vs1 is applied to a source in the first region 102 and the second region 104 (through the source contacts 216a, 216b, 220a, and 220b), and a voltage Vd1 is applied to a drain of the second region 104 (through the drain contacts 222a), the embedded doped region 212 and the embedded doped region 214 may serve as a part of a current path P1, so that a current may flow from one of the composite punch cells to a target cell. Similarly, when a voltage Vg1 is applied to a word line W1, a voltage Vs2 is applied to a source (through the source contact 216a, 216b, 220a, and 220b) and a voltage Vd2 is applied to a drain in the first region 102 (through the drain contact 218a), the embedded doped region 212 and the embedded doped region 214 may serve as a part of a current path P2, so that the current may flow from another one of the composite punch cells to a target cell.

Figure 1C:
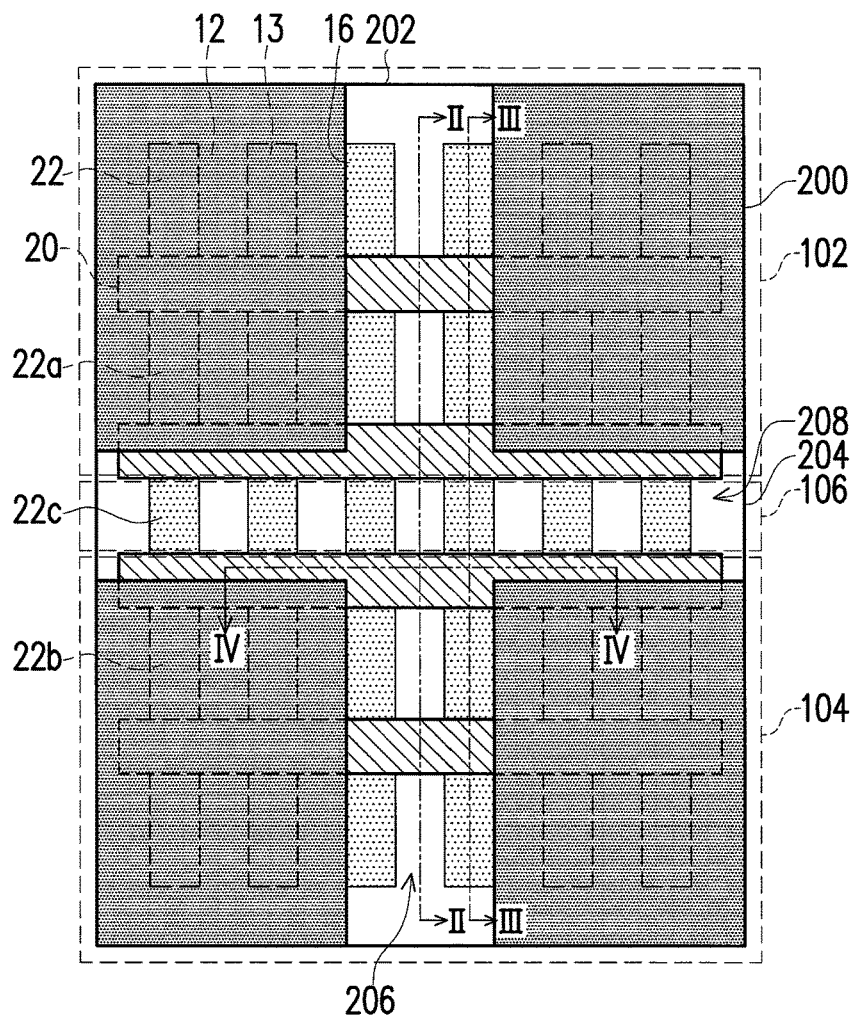
Figure 2C:
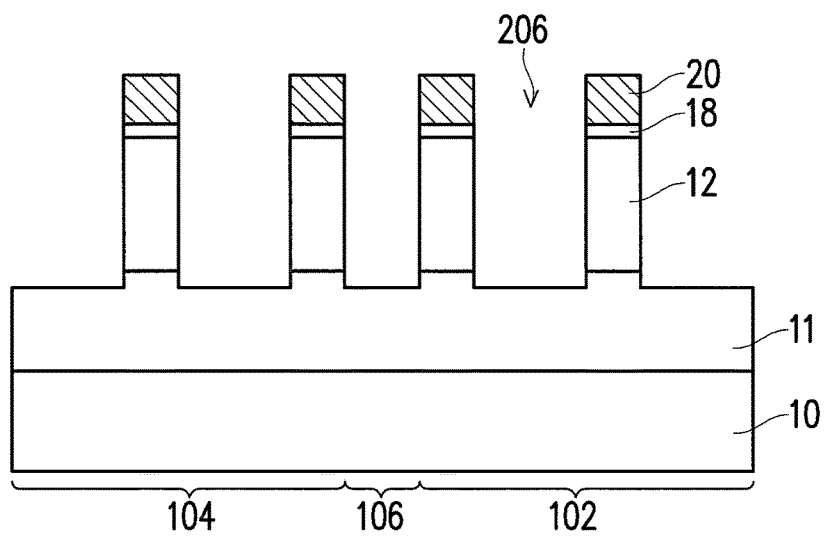
Figure 1D:
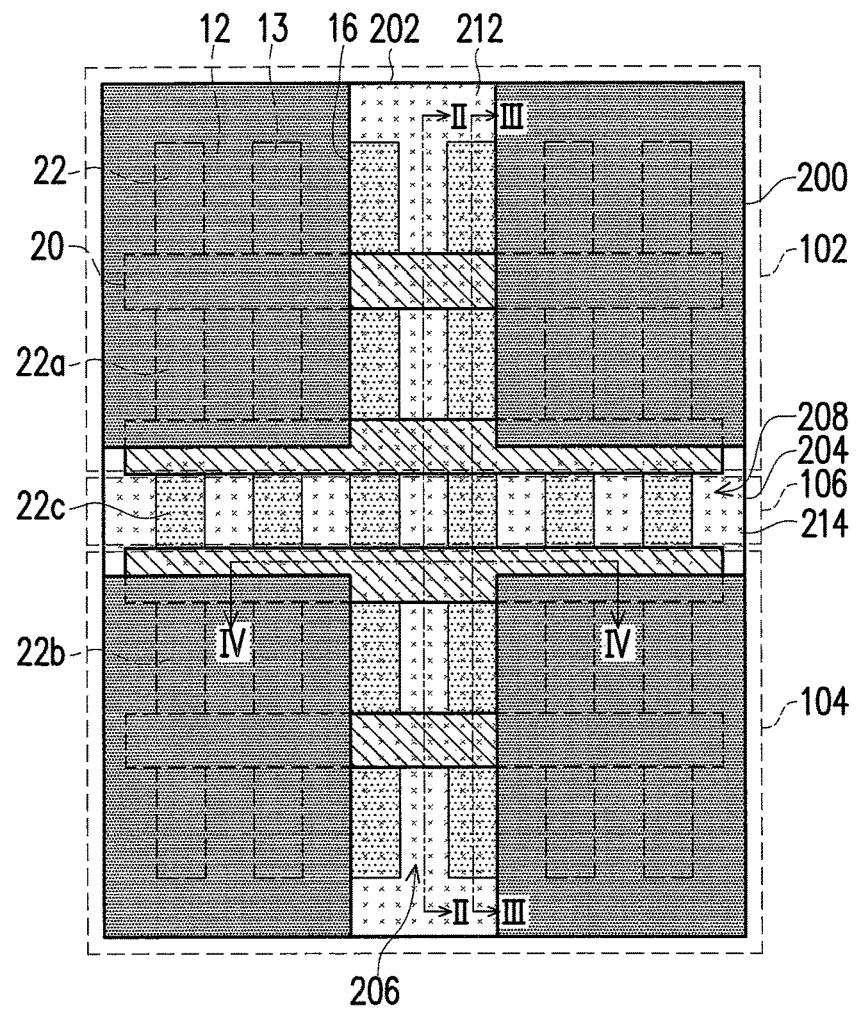
Figure 2D:
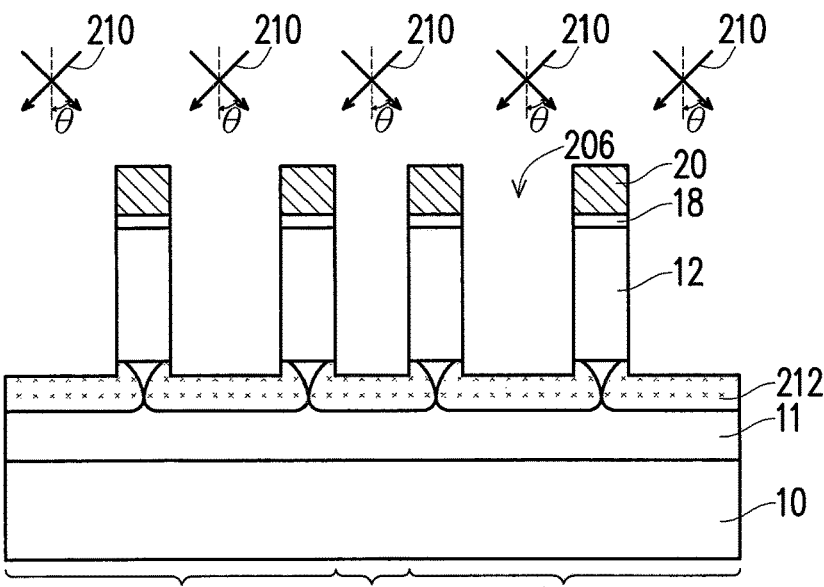
Figure 1E:
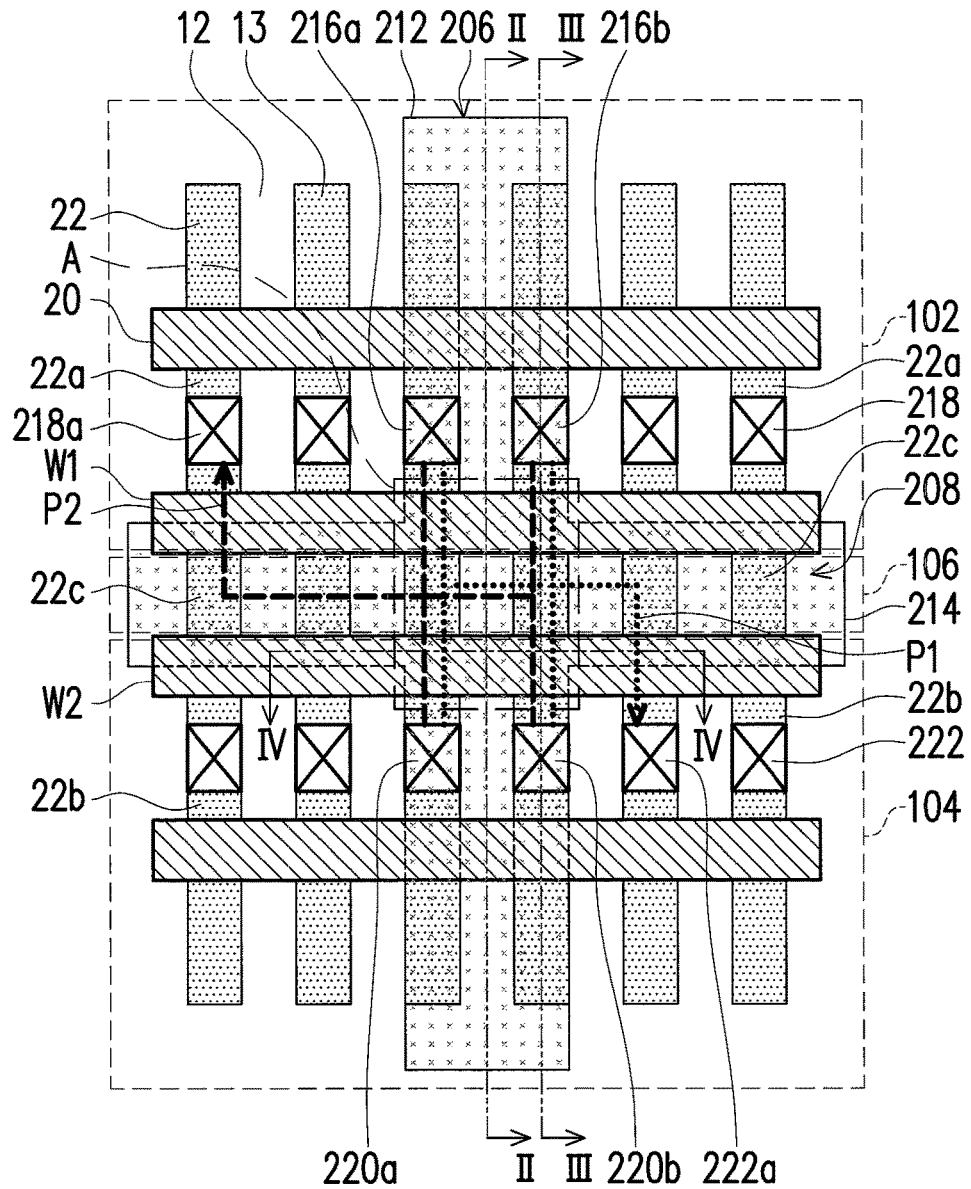
Figure 2E:
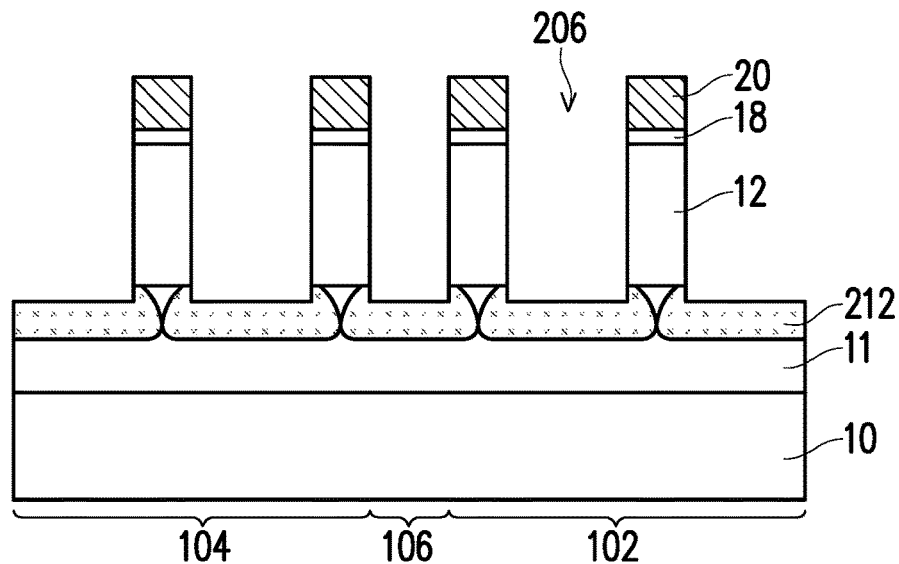
Figure 3E:
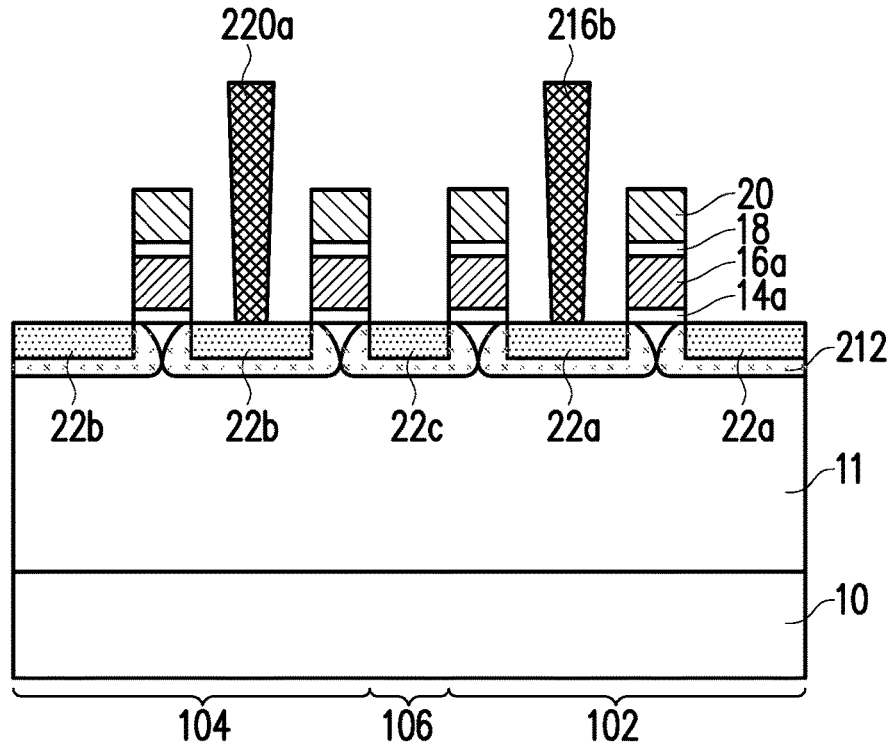
FIG. 3A to FIG. 3E illustrate cross-sectional views of FIG. 1A to FIG. 1E along line III-III.
Figure 3A:
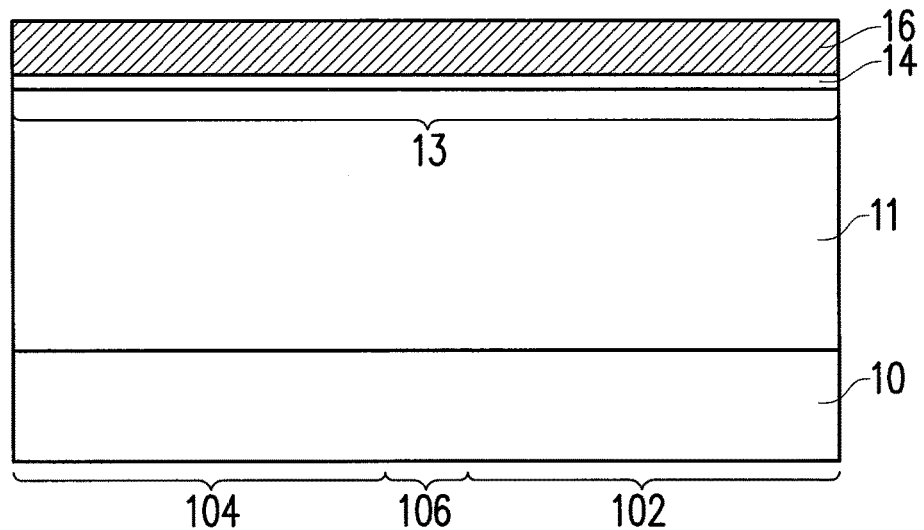
Figure 4A:
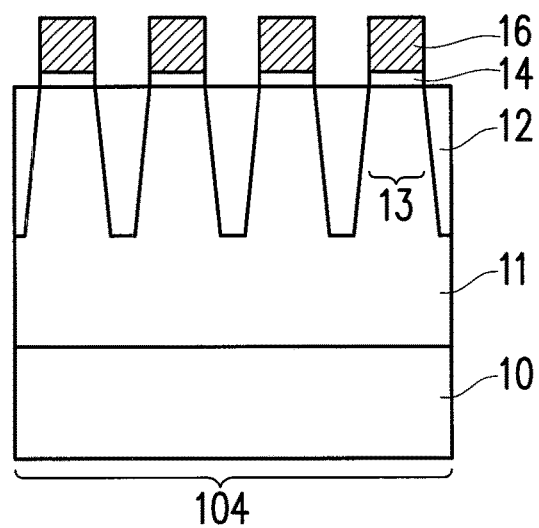
FIG. 4A to FIG. 4E illustrate cross-sectional views of FIG. 1A to FIG. 1E along line IV-IV.
Figure 3B:
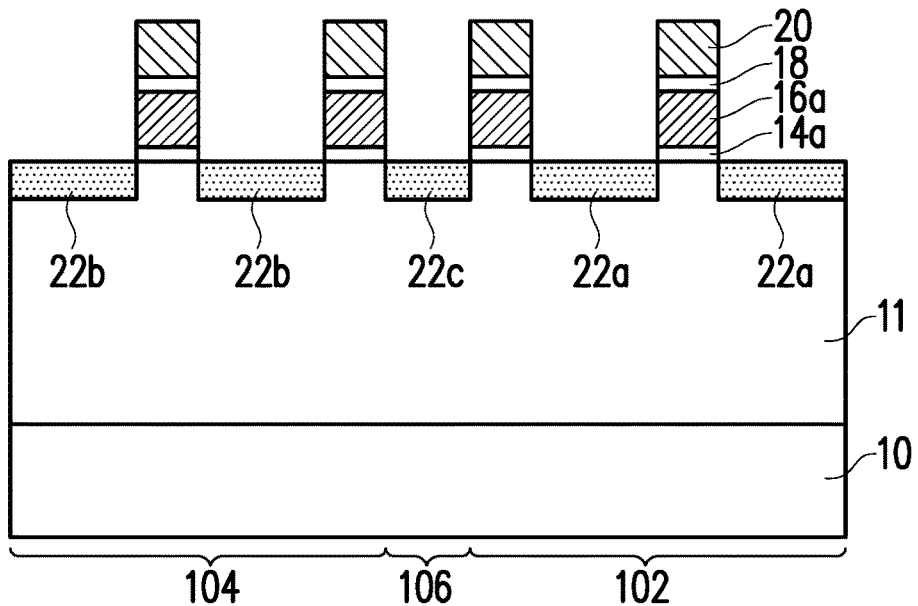
Figure 4B:
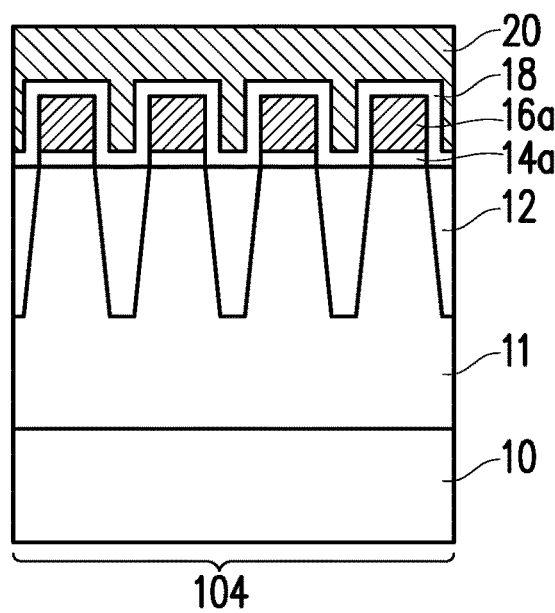
Figure 3C:
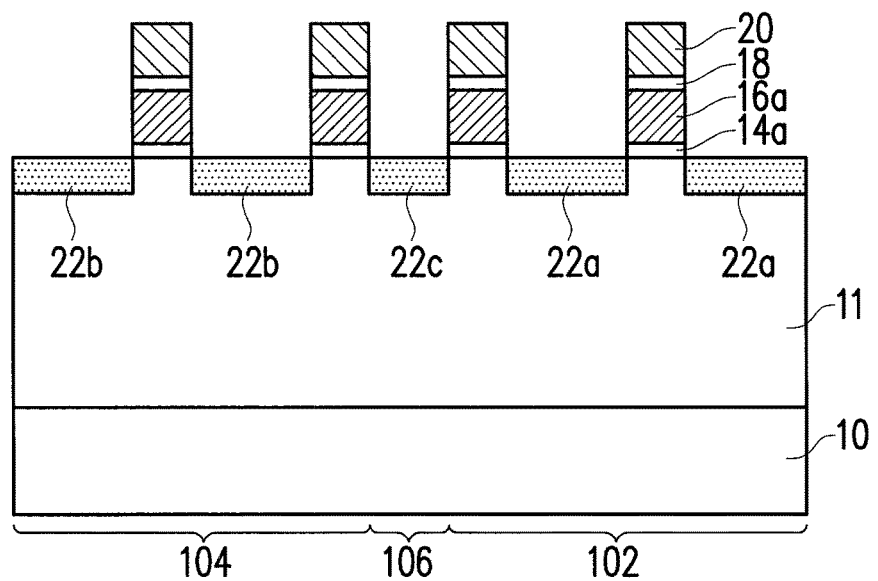
Figure 4C:
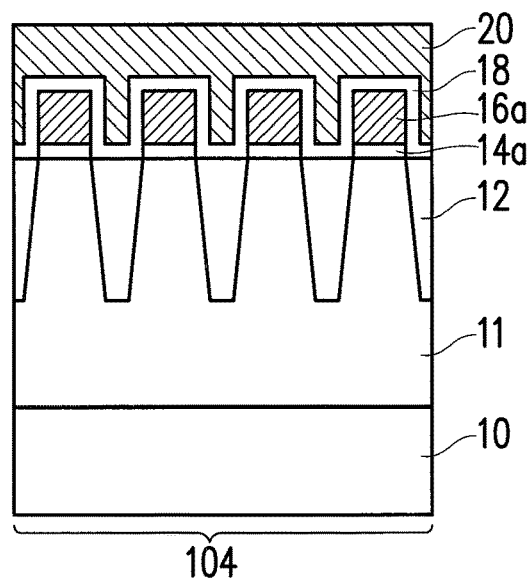
Figure 3D:
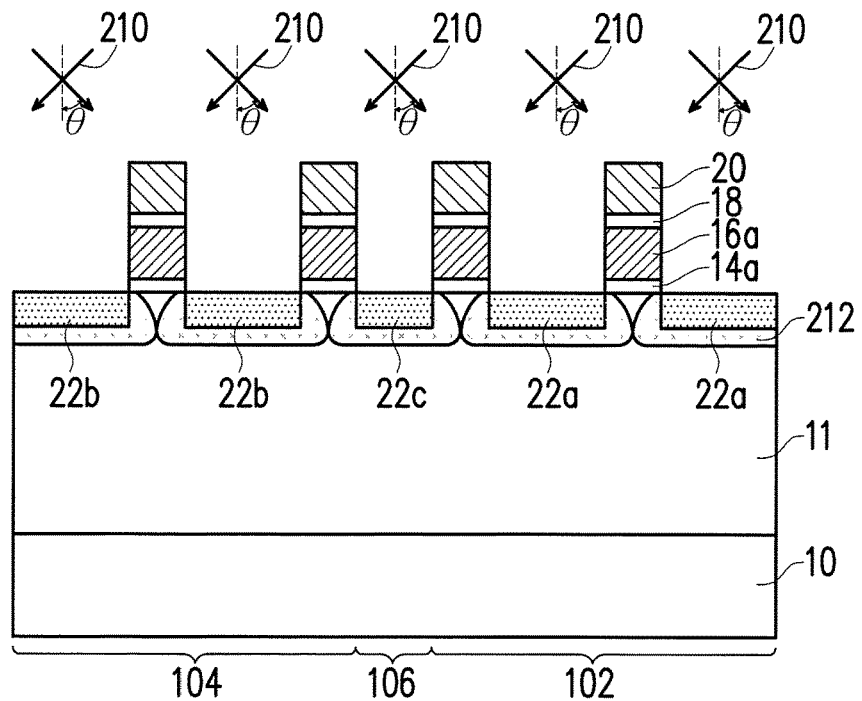
Figure 4D:
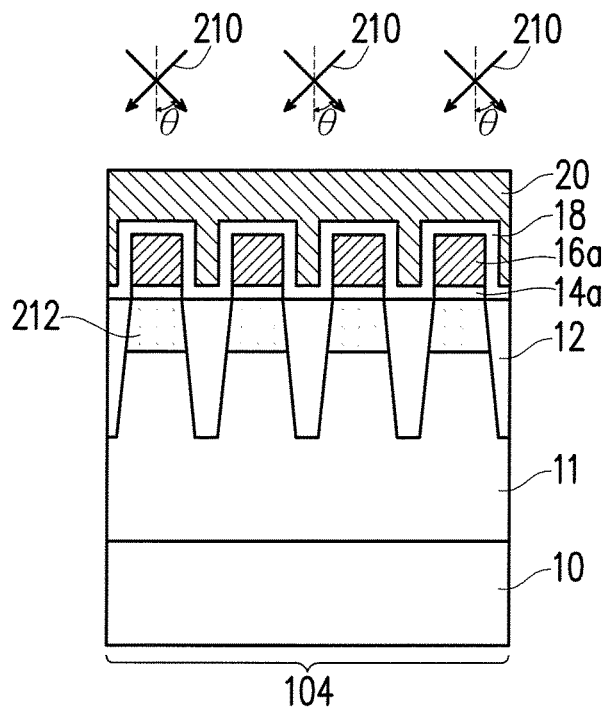
Figure 4E:
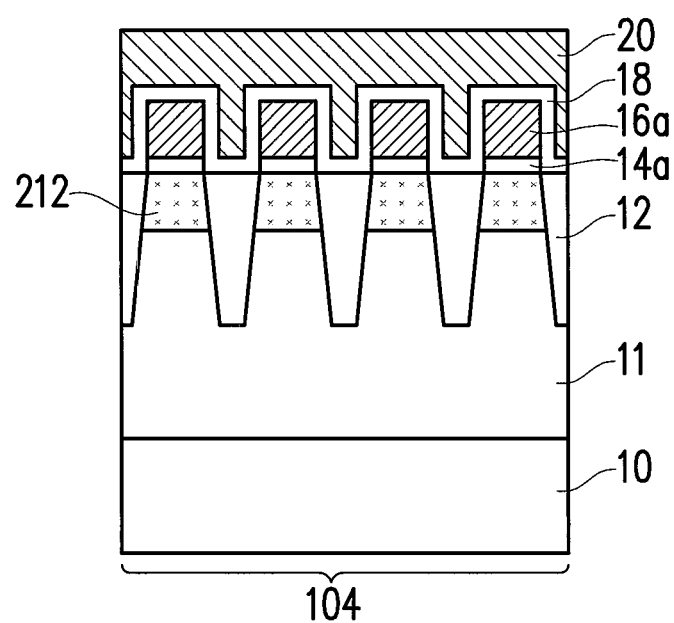

Referring to FIG. 1C to FIG. 1E, in foregoing first embodiment, the mask layer 200 is used as the etching mask for forming the self-align trenches 206 and the self-align trenches 208 and the implanting mask for forming the embedded doped regions 212 and 214. The first opening 202 of the mask layer 200 exposes the adjacent two columns of the doped regions 22a, the adjacent two columns of the doped regions 22b and the adjacent two of the doped regions 22c, the part of the conductive layers (the control gates) 20 and one isolation structure 12. Therefore, the width of the first opening 202 of the mask layer 200 is substantially equal to a sum of widths of the one isolation structure 12 and the adjacent two of the doped regions 22a. However, the widths of the first opening and the second opening of the mask layer of the invention are not limited to the above, which may be adjusted based on actual requirements. In addition, the two source contacts 216a and 216b and the two source contacts 220a and 220b are correspondingly disposed on the two doped regions 22a and the two doped regions 22b, respectively. However, positions and quantities of the source contacts are not limited to the above either, which may be adjusted based on actual requirements.

Figure 5:
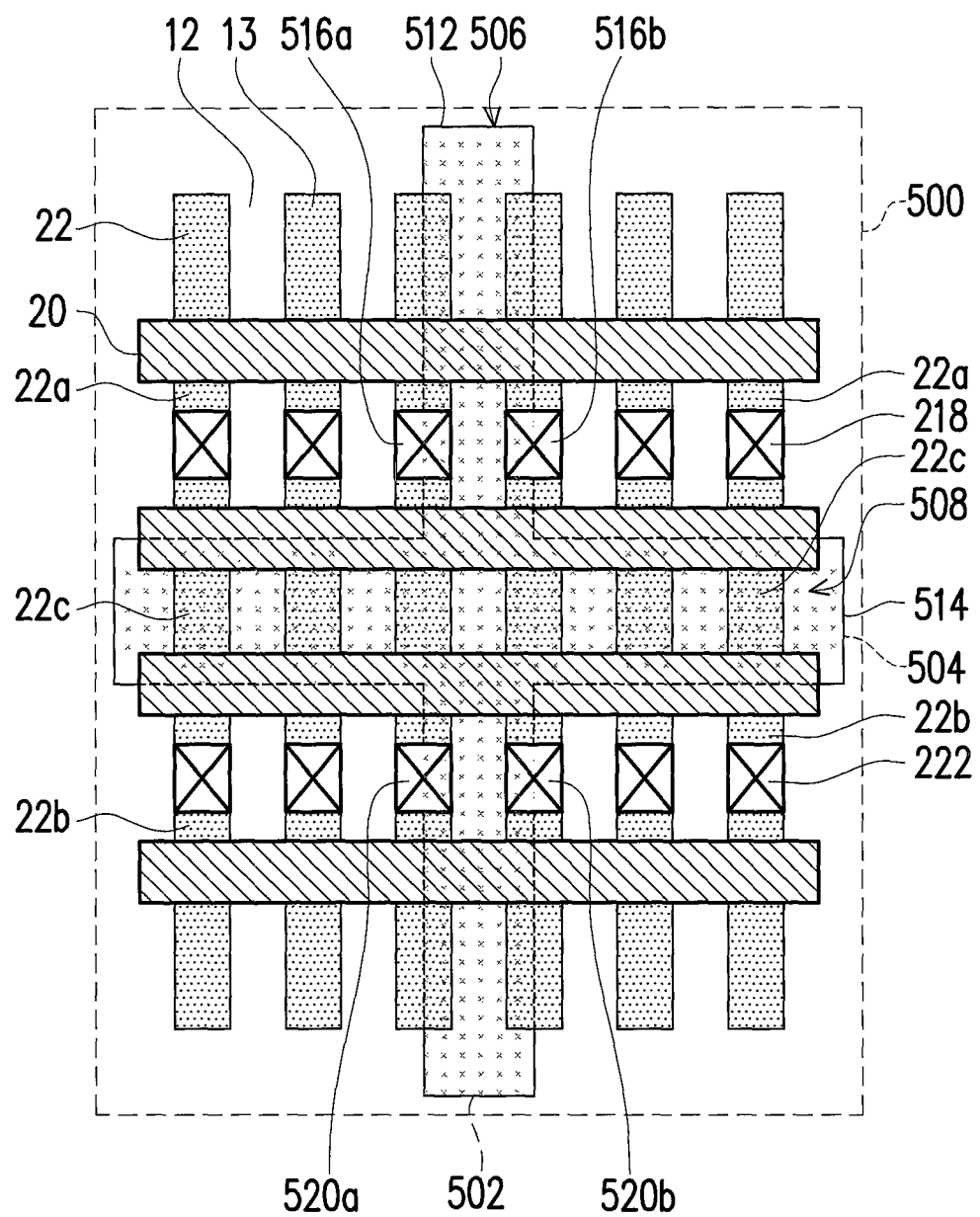
FIG. 5 is a top view illustrating a method fabricating a memory device according to second embodiment of the invention.

FIG. 5 is a top view illustrating a method fabricating a memory device according to second embodiment of the invention.

Referring to FIG. 5, in second embodiment of the invention, a mask layer 500 is used as an etching mask for forming self-align trenches 506 and self-align trenches 508 and an implanting mask for forming embedded doped regions 512 and 514. A first opening 502 of the mask layer 500 exposes a part of the adjacent two columns of the doped regions 22a, a part of the adjacent two columns of the doped regions 22b and a part of the adjacent two of the doped regions 22c, a part of the conductive layers (the control gates) 20 and one isolation structure 12. Therefore, a width of the first opening 502 of the mask layer 500 is substantially equal to a sum of widths of one isolation structure 12 and the part of the adjacent two of the doped regions 22a; and a width of a second opening 504 is substantially identical to the width of the second opening 204 (FIG. 1C) of first embodiment.

Therefore, a width of the formed embedded doped region 512 is less than the width of the embedded doped region 212 (FIG. 1D) of first embodiment; and a width of the embedded doped region 514 is substantially identical to the width of the embedded doped region 214 of first embodiment. In addition, positions of the two source contacts 516a and 516b and the two source contacts 520a and 520b are also disposed on the adjacent two of the doped regions 22a closest to the embedded doped region 214 and the adjacent two of the doped regions 22b closest to the embedded doped region 214, respectively, and electrically connected to the embedded doped region 512.

Figure 6:
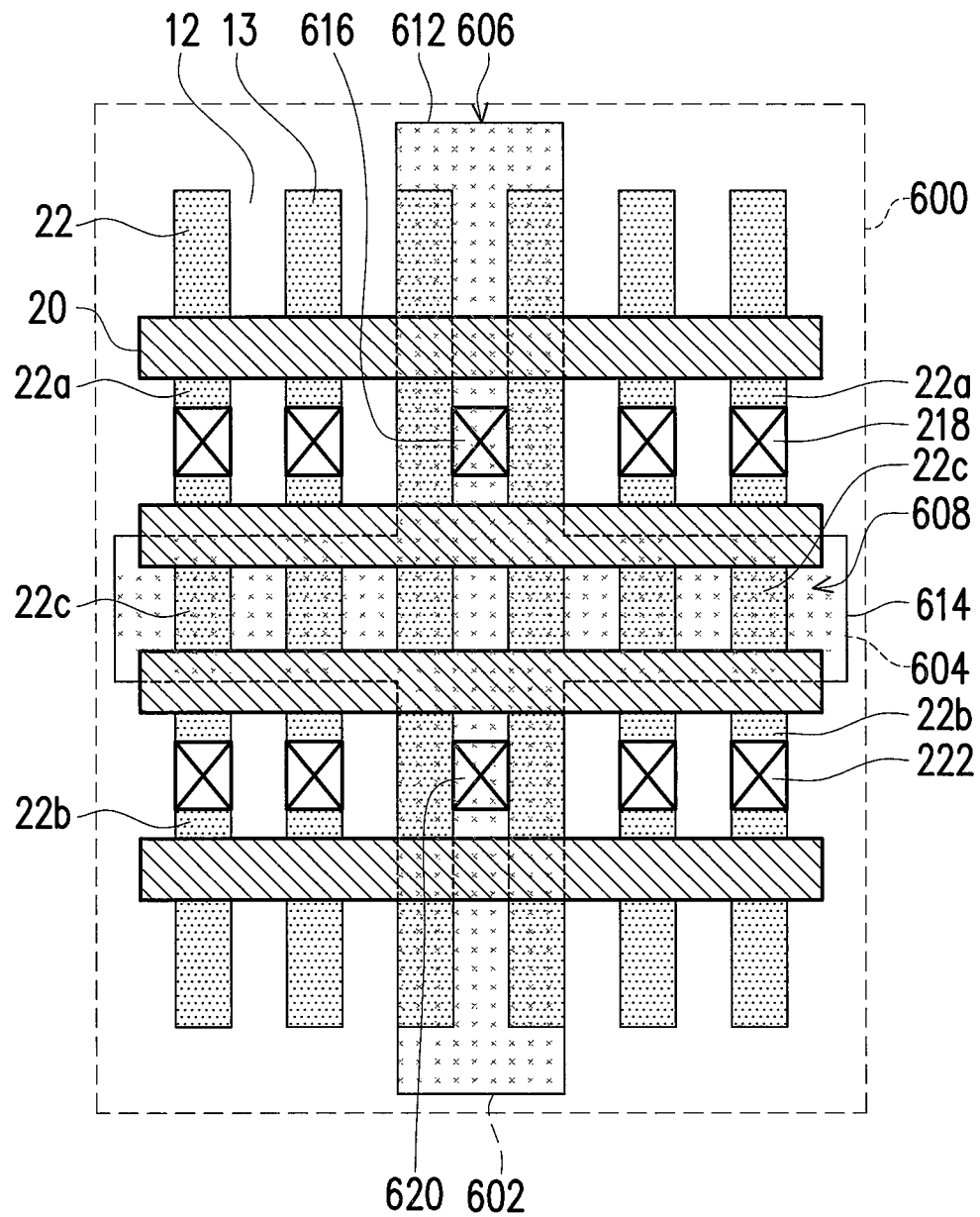
FIG. 6 is a top view illustrating a method fabricating a memory device according to third embodiment of the invention.

FIG. 6 is a top view illustrating a method fabricating a memory device according to third embodiment of the invention.

Referring to FIG. 6, in third embodiment, a mask layer 600 is used as an etching mask for forming self-align trenches 606 and self-align trenches 608 and an implanting mask for forming embedded doped regions 612 and 614. A width of a first opening 602 of the mask layer 600 is substantially identical to the width of the first opening 202 (FIG. 1C) of first embodiment; and a width of a second opening 604 is substantially identical to the width of the second opening 204 (FIG. 1C) of first embodiment. Therefore, a width of the formed embedded doped region 612 is substantially identical to the width of the embedded doped region 212 (FIG. 1D) of first embodiment; and a width of the embedded doped region 614 is substantially identical to the width of the embedded doped region 214 (FIG. 1D) of first embodiment. One source contact 616 is disposed on the self-align trenches 606 between the adjacent two of the doped regions 22a closest top the embedded doped region 214, and such source contact 616 is electrically connected to the embedded doped region 612; and one source contact 620 is disposed on the self-align trenches 606 between the adjacent two of the doped regions 22b closest to the embedded doped region 214, and such source contact 620 is electrically connected to the embedded doped region 612.

Figure 7:
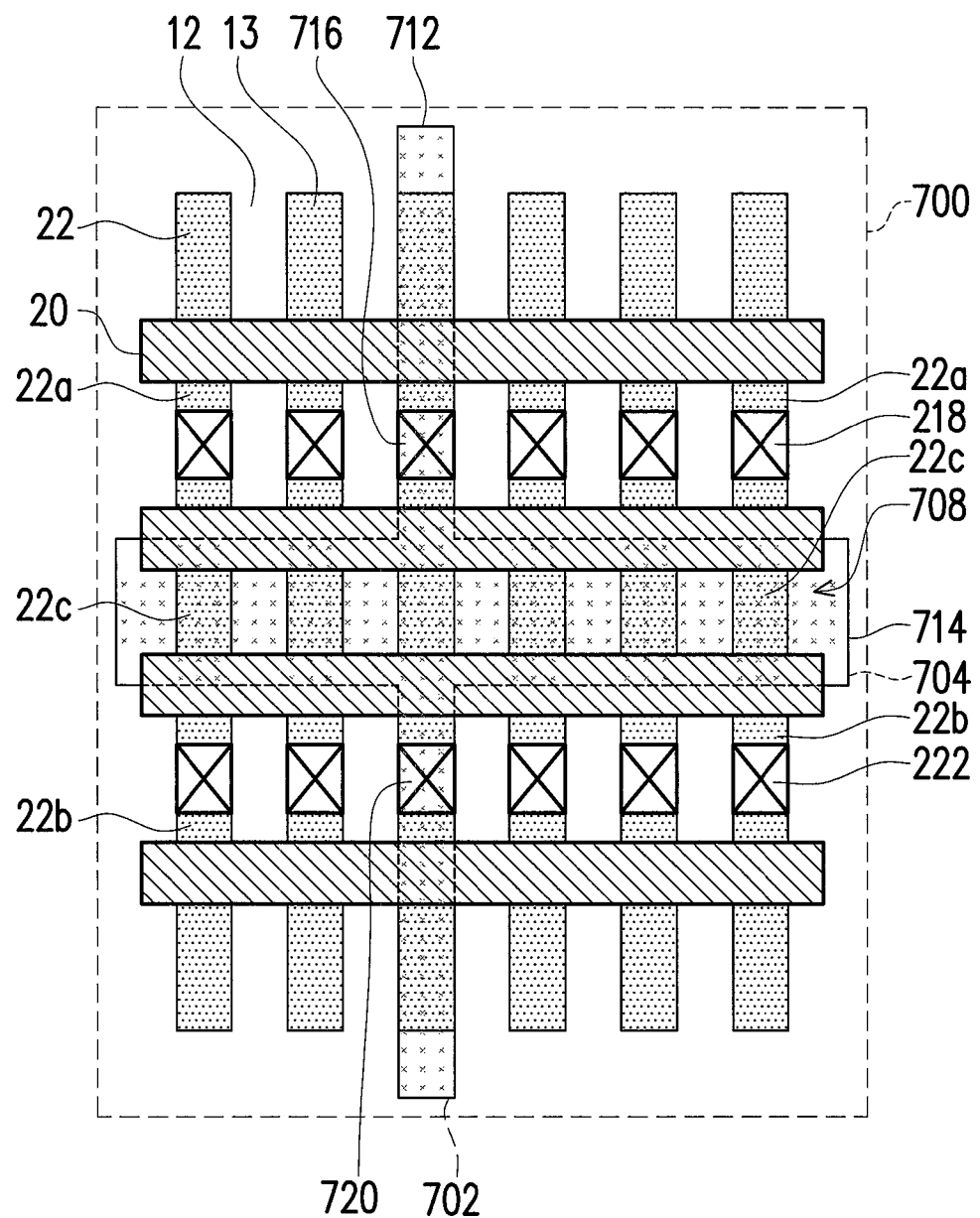
FIG. 7 is a top view illustrating a method fabricating a memory device according to fourth embodiment of the invention.

FIG. 7 is a top view illustrating a method fabricating a memory device according to fourth embodiment of the invention. Referring to FIG. 7, in fourth embodiment of the invention, a mask layer 700 is used as an etching mask for forming a plurality of self-align trenches 708 and an implanting mask for forming embedded doped regions 712 and 714. A first opening 702 of the mask layer 700 exposes one column of the doped regions 22a, one of the doped regions 22c, one column of the doped regions 22b and a part of the conductive layers (the control gates) 20. Therefore, in the present embodiment, only the self-align trenches 708 are formed under the second opening 704, and no self-align trench (such as the self-align trenches 206 in first embodiment of FIG. 1C) is formed under the first opening 702. A width of the first opening 702 of the mask layer 700 is equal to the width of one doped region 22a, and a width of the formed embedded doped region 712 is less than the width of the embedded doped region 212 of first embodiment (FIG. 1D). A width of the second opening 704 of the mask layer 700 is substantially identical to the width of the second opening 204 (FIG. 1C) of first embodiment. Therefore, a width of the formed embedded doped region 714 is substantially identical to the width of the embedded doped region 214 (FIG. 1D) of first embodiment. In addition, one source contact 716 is disposed on the doped regions 22a closest to the embedded doped region 214, and the source contact 716 is electrically connected to the embedded doped region 712; and one source contact 720 is disposed on the doped regions 22b closest to the embedded doped region 214, and the source contact 720 is electrically connected to the embedded doped region 712.

Figure 8:
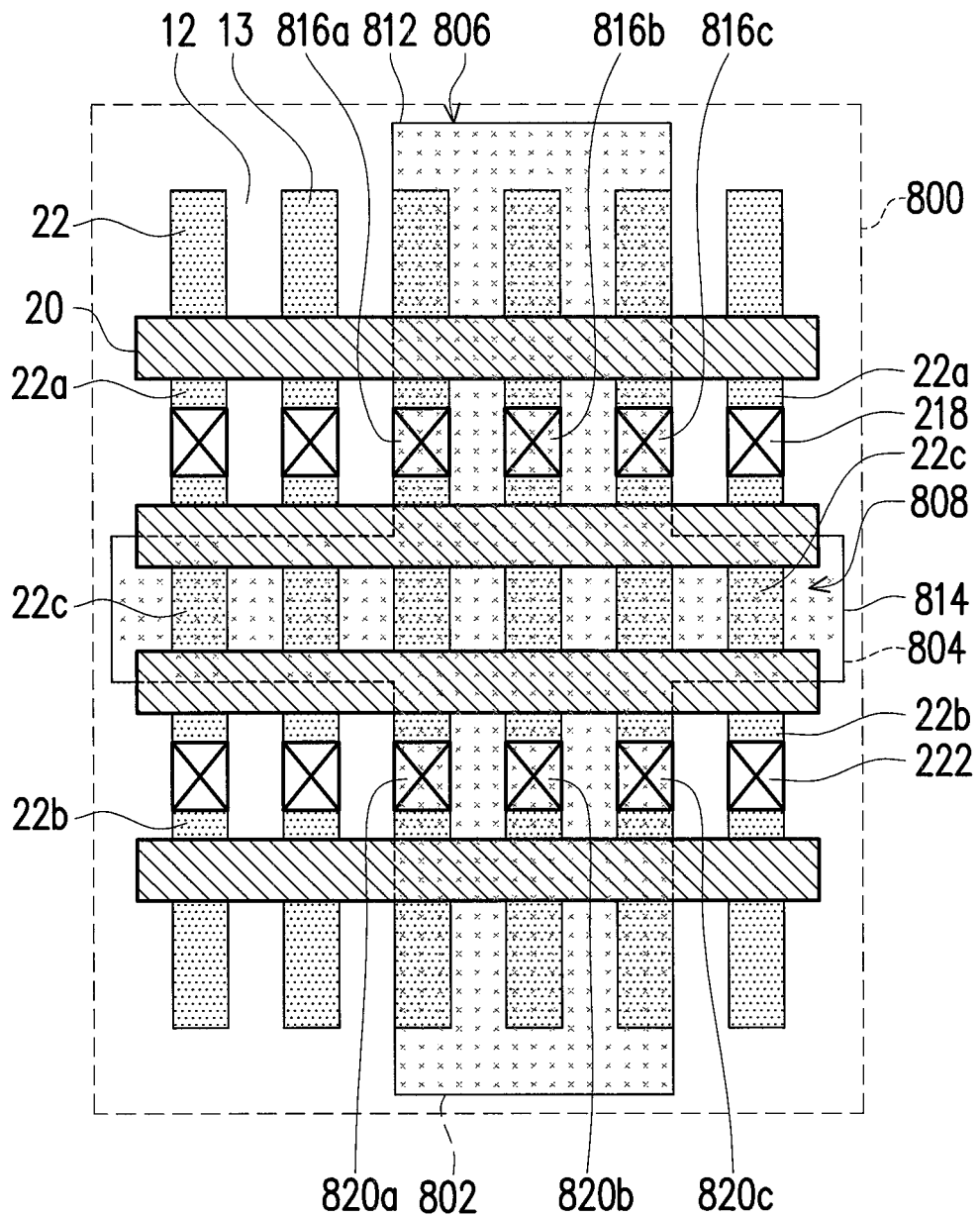
FIG. 8 is a top view illustrating a method fabricating a memory device according to fifth embodiment of the invention.

FIG. 8 is a top view illustrating a method fabricating a memory device according to fifth embodiment of the invention. Referring to FIG. 8, in fifth embodiment, a mask layer 800 is used as an etching mask for forming self-align trenches 806 and self-align trenches 808 and an implanting mask for forming embedded doped regions 812 and 814. A first opening 802 of the mask layer 800 exposes adjacent columns of the doped regions 22a, adjacent columns of the doped regions 22b and a plurality of adjacent doped regions 22c, a part of the conductive layers (the control gates) 20 and a plurality of isolation structures 12 being enclosed. Accordingly, multiple columns of the self-align trenches 806 may be correspondingly formed under the first opening 802. A width of the first opening 802 is substantially equal to a sum of widths of the doped regions 22a and the isolation structures being enclosed, thus a width of the formed embedded doped region 812 is greater than the width of the embedded doped region 212 (FIG. 1D) of first embodiment. A width of the second opening 804 of the mask layer 800 is substantially identical to the width of the second opening 204 of first embodiment. Therefore, a width of the formed embedded doped region 814 is substantially identical to the width of the embedded doped region 214 (FIG. 1D) of first embodiment. In addition, positions of the source contacts 816a, 816b and 816c and the source contacts 820a, 820b and 820c are disposed on the doped regions 22a closest to the embedded doped region 214 and the doped regions 22b closest to the embedded doped region 214, respectively, and electrically connected to the embedded doped region 812.

In view of above, the invention is capable of forming the embedded doped region with low resistance which passes through the control gate and connects the doped regions in series in the substrate by using the ion implantation process. The embedded doped region may be electrically connected to the source contacts to serve as the source rail. Further, another embedded doped region with low resistance may be formed between the two regions at the same time. In addition, the source contacts and the drain contacts at the same region are disposed at the same side and arranged into the same row, so as to reduce asymmetry of the exposed pattern and complexity in manufacturing the photomask. Also, the process of fabricating the embedded doped region may be integrated with the existing processes without additional photomask, and has a capability of self-aligning in providing preferable processing allowance and uniformity. In addition, because the layout of the embedded doped region is substantially in straight line rather than bent-shape, the complex optical proximity correction is not required so as to significantly reduce the manufacturing cost. Furthermore, the layout of the embedded doped region being substantially in straight line rather than the bent-shape may also save the die area for more than 3%.

It will be apparent to those skilled in the art that various modifications and variations can be made to the structure of the disclosed embodiments without departing from the scope or spirit of the disclosure. In view of the foregoing, it is intended that the disclosure cover modifications and variations of this specification provided they fall within the scope of the following claims and their equivalents.

What is claimed is:

1. A memory device, comprising:
   a substrate, having a first region, a second region, and a third region, wherein the third region is located between the first region and the second region and has a plurality of first self-align trenches;

a first embedded doped region extending along a first direction, and located in a portion of the substrate in a part of the first region, a portion of the substrate in a part of the second region, and a portion of the substrate in a part of the third region;

a second embedded doped region extending along a second direction, located in the substrate at bottoms and around sidewalls of the plurality of first self-align trenches in the third region, the first embedded doped region being electrically connected to the second embedded doped region, and the first direction being different from the second direction;

a plurality of control gates extending along the second direction, located at two sides of the second embedded doped region, and crossed over the first embedded doped region;

a plurality of floating gates, each of the plurality of floating gates being located between an overlapping control gate among the plurality of control gates and the substrate;

a plurality of tunneling dielectric layers, each of the plurality of tunneling dielectric layers being located between an overlapping floating gate among the plurality of floating gates and the substrate;

a plurality of inter-gate dielectric layers, each of the plurality of inter-gate dielectric layers being located between an underlying floating gate among the plurality of floating gates and an overlapping control gate among the plurality of control gates;

a plurality of first doped regions located in the substrate at two sides of each of the control gates in the first region;

a plurality of second doped regions located in the substrate at two sides of each of the control gates in the second region; and a plurality of third doped regions located in the substrate in the third region, wherein the first embedded doped region crosses under the plurality of control gates and is in contact with at least two of the plurality of first doped regions, at least two of the plurality of second doped regions and at least two of the plurality of third doped regions, and the second embedded doped region is electrically connected to the plurality of third doped regions.

2. The memory device of claim 1, further comprising:
a first source contact, located in the first region, and located on at least one first doped region that is electrically connected to the first embedded doped region and closest to the second embedded doped region; and
a second source contact, located in the second region, and located on at least one second doped region that is electrically connected to the first embedded doped region and closest to the second embedded doped region.

3. The memory device of claim 1, wherein the first embedded doped region is electrically connected to at least two adjacent columns of the plurality of first doped regions, at least two adjacent columns of the plurality of second doped regions, and at least two adjacent third doped regions, and further extending to the substrate at bottoms and around sidewalls of a plurality of second self-align trenches, wherein the plurality of second self-align trenches extend along the first direction arranged into a column, and located between the at least two adjacent columns of the plurality of first doped regions that are electrically connected to the first embedded doped region, between the at least two adjacent columns of the plurality of second doped regions that are electrically connected to the first embedded doped region, and between the at least two adjacent third doped regions that are electrically connected to the first embedded doped region.

4. The memory device of claim 3, further comprising:
a first source contact located on the second self-align trenches closest to the second embedded doped region in the first region electrically connected to the first embedded doped region; and
a second source contact located on the second self-align trenches closest to the second embedded doped region in the second region electrically connected to the first embedded doped region.

5. The memory device of claim 3, further comprising:
at least two first source contacts, located in the first region, and located on at least two adjacent first doped regions that are electrically connected to the first embedded doped region and closest to the second embedded doped region; and
at least two second source contacts, located in the second region, and located on at least two adjacent second doped regions that are electrically connected to the first embedded doped region and closest to the second embedded doped region.

6. The memory device of claim 1, wherein the first embedded doped region is electrically connected adjacent columns of the plurality of first doped regions and adjacent columns of the plurality of second doped regions, and further extending to the substrate at bottoms and around sidewalls of a plurality of second self-align trenches, wherein the plurality of second self-align trenches extend along the first direction arranged into a plurality of columns, each column of the plurality of second self-align trenches is located in the substrate between two adjacent columns of the plurality of first doped regions that are electrically connected to the first embedded doped region, between two adjacent columns of the plurality of second doped regions that are electrically connected to the first embedded doped region, and between two adjacent third doped regions that are electrically connected to the first embedded doped region.

7. The memory device of claim 6, further comprising:
a plurality of first source contacts, located in the first region, and located on a plurality of the first doped regions that is electrically connected to the first embedded doped region and closest to the second embedded doped region; and
a plurality of second source contacts, located in the second region, and located on a plurality of the second doped regions that is electrically connected to the first embedded doped region and closest to the second embedded doped region.

* * * * *